United States Patent [19]

Goldberg

[11] 4,031,476
[45] June 21, 1977

[54] NON-INTEGER FREQUENCY DIVIDER HAVING CONTROLLABLE ERROR

[75] Inventor: Edwin Allen Goldberg, Princeton, N.J.

[73] Assignee: RCA Corporation, New York, N.Y.

[22] Filed: May 12, 1976

[21] Appl. No.: 685,549

[52] U.S. Cl. .................................. 328/39; 328/42; 328/48; 235/92 DM
[51] Int. Cl.² ................. H03K 27/00; H03K 23/00
[58] Field of Search ............ 307/220, 225; 328/39, 328/42, 48; 235/92 DM, 92 TE

[56] References Cited
UNITED STATES PATENTS

| | | | |
|---|---|---|---|
| 3,189,832 | 6/1965 | Pugh | 328/42 |
| 3,446,947 | 5/1969 | Overstreet, Jr. | 328/39 |
| 3,605,025 | 9/1971 | Lincoln et al. | 328/42 |
| 3,614,631 | 10/1971 | Bevier | 328/48 |
| 3,716,794 | 2/1973 | Teggatz et al. | 328/39 |
| 3,818,354 | 6/1974 | Tomisawa et al. | 328/42 |
| 3,896,387 | 7/1975 | Kokado | 328/39 |
| 3,976,946 | 8/1976 | Schroder | 328/39 |

*Primary Examiner*—Stanley D. Miller, Jr.
*Attorney, Agent, or Firm*—Carl M. Wright; H. Christoffersen; S. Cohen

[57] ABSTRACT

System and method for dividing an input frequency to produce an output frequency related to the input frequency by a non-integral ratio. The divider ratio is alternated between the integer values bracketing the non-integer ratio according to the accumulated value of known errors associated with each integer divisor value by comparing the accumulated error value to a given value.

4 Claims, 5 Drawing Figures

NON-INTEGER FREQUENCY DIVIDER HAVING CONTROLLABLE ERROR

The Government has rights in this invention pursuant to Contract No. N00014-75C-1148 awarded by the Department of the Navy.

BACKGROUND OF THE INVENTION

Dividing a reference frequency is a useful and accurate way to derive a desired output frequency. When the divisor is an integral power of two, the use of a binary counter provides a simple and accurate circuit for dividing the reference frequency. If the divisor is some other integer, slightly more complicated binary counters employing feedback can be used.

When a frequency is not directly obtainable by dividing a reference frequency by an integer, the output frequency is usually derived by some combination of mixers, dividers, multipliers, and phase lock oscillators. These systems are often quite complex and expensive to implement.

The invention described herein utilizes the accuracy of digital counters and devices to produce an output frequency derived from a reference frequency by dividing the latter by a non-integer value.

BRIEF SUMMARY OF THE INVENTION

A system which produces a second frequency from a first frequency to which it is related by non-integral ratio, has a gating circuit for receiving the first frequency and for producing output pulses in response thereto. The output pulses from the gating circuit drive a divider which produces the second frequency. A controller, which is responsive to the second frequency, controls the gating means to reduce the accumulated time error in the second frequency.

DETAILED DESCRIPTION OF THE INVENTION

For purposes of illustration, the invention will be described generally in terms of an input, or first frequency, $f_i$, to be divided to produce an output, or second frequency, $f_o$, and also particularly in terms of an illustrative example for dividing a frequency of 1,420,405, 751 Hz., the frequency of oscillation of a hydrogen maser, to produce a frequency of 10,230,000 Hz.

The ratio of the first frequency to the second frequency is the non-integer divisor which is to be incorporated by the invention. That is, $f_i/f_o = D$, where D is not an integer. In the illustrative example, D equals approximately 138.847092. If M denotes the largest integer less than D, then M+1 is the smallest integer greater than D and M and M+1 can be characterized by $M = (\text{max. int.} < f_i/f_o)$,
and $M+1 = (\text{min. int.} > f_i/f_o)$ In the illustrative example, M has a value of 138 and M+1, a value of 139.

Figure 1:
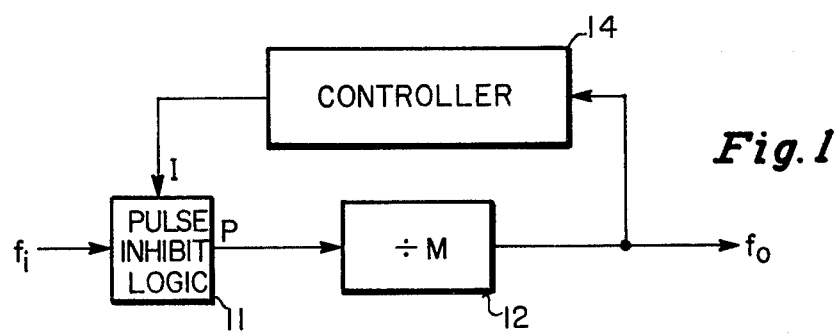
FIG. 1 is a block diagram of a preferred embodiment of the invention.

In the system shown in FIG. 1, the input (first) frequency is supplied to a pulse inhibit logic network or gating circuit 11 which produces pulses in response thereto which are coupled to a divide-by-M counter 12. The output signal from the counter 12 is the system output (second) frequency; it is coupled to a controller 14. The controller 14 accumulates a known time error associated with the output frequency as the result of dividing by M or M+1. If the accumulated error is less than a given value, an inhibit signal is provided by the controller 14 to the pulse inhibit logic 11, which inhibits one cycle or pulse of the input frequency signal during one period of the output frequency in response to the inhibit signal. The effect of inhibiting one input pulse during a period of the output frequency, $f_o$, is that the input frequency is divided by M+1 instead of M. Therefore, the system shown in FIG. 1 divides the input frequency by M or M+1 for several periods and then by M+1 or M for a certain number of periods so that the resulting time averaged output frequency is the input frequency divided by a value between M and M+1 which closely approximates D.

Figure 2:
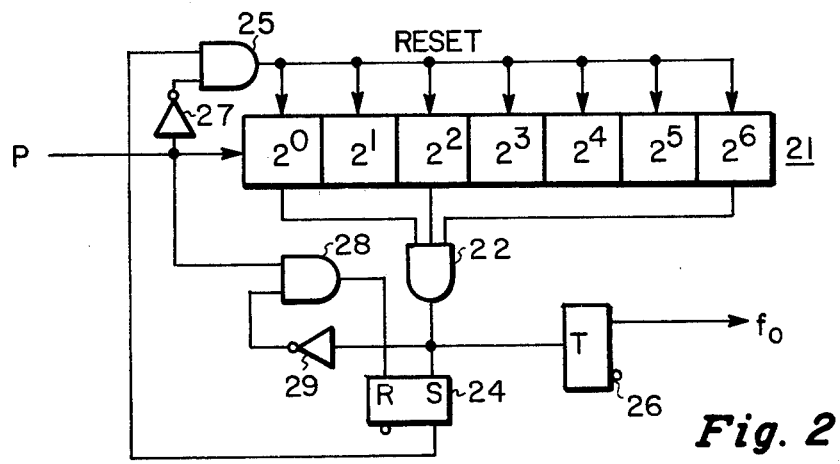
FIG. 2 is a logic diagram illustrating a divide-by-138 counter.

The operation of the various circuits shown in the embodiment of FIG. 1 will now be described in more detail. FIG. 2 is a logic diagram of a divide-by-138 counter. The input pulses are applied to the least significant stage of a seven-stage binary ripple counter 21. An AND gate 22 is enabled when the $2^6$, $2^2$, and the $2^0$ stages of the counter 21 are set. The output signal from the AND gate 22 therefore sets an SR-type flip-flop 24 when sixty-nine input pulses have been counted. The output signal from the AND gate 22 also triggers a T-type flip-flop 26 which produces an output frequency which is one-half the frequency at its trigger input; in this case, an output frequency equal to the input frequency divided by 138 is produced. When the flip-flop 24 is set, and AND gate 25 is primed by the set output signal therefrom so that when the value of P is logical zero, the AND gate 25 is enabled by the logical one output signal from an inverter 27. The output signal from the activated AND gate 25 resets all the stages of the counter 21 causing the output signal from the AND gate 22 to become a logical zero which is inverted to a logical one by an inverter 29, whose output signal primes an AND gate 28. The next input pulse enables the AND gate 28, which resets the flip-flop 24, and triggers the counter 21, which begins to count 69 pulses to repeat the above-described operation. The circuit shown in FIG. 2 is a counter useful in the embodiment of the system of FIG. 1 as the divide-by-M counter 12 where M=138 in the illustrative example. Such counters are well known in the art and can be designed for any value of M.

Figure 3:
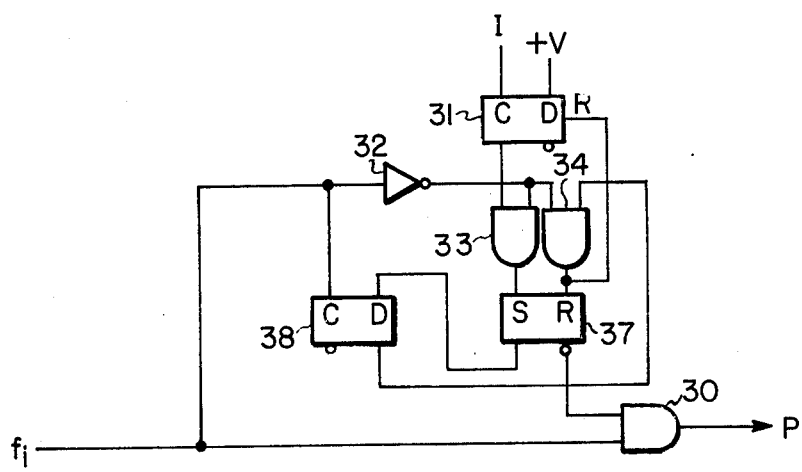
FIG. 3 is a logic diagram illustrating an embodiment of a gating circuit or a pulse inhibit logic circuit.

FIG. 3 shows a suitable logic network for performing the functions of the pulse inhibit logic 11 (FIG. 1). The function of the pulse inhibit logic is to inhibit one pulse from $f_i$ from being gated as an output pulse when an inhibit signal occurs during a period of $f_o$. The logic should function as described for any duration of the inhibit signal, and only one pulse should be deleted during one period of the output frequency $f_o$. If the inhibit signal occurs during a period of an input pulse, the full output signal should be generated for that input signal, i.e., no shortened pulses should be generated.

In the circuit shown in FIG. 3, a D-type flip-flop 31 is set by the positive-going edge of the inhibit signal. Output pulses are produced by the input signal, $f_i$, via an AND gate 30 which is primed by the reset output signal from an SR-type flip-flop 37. When the input signal, $f_i$ changes to a logical zero, the output signal from an inverter 32 enables an AND gate 33 whose output signal sets the SR flip-flop 37. The next input signal, i.e., an $f_i$ signal of logical one, is inhibited by the logical zero reset output signal from the flip-flop 37. A D-type flip-flop 38 is set by the same $f_i$ input signal by virtue of the set output signal from the flip-flop 37. When the input signal $f_i$ next changes to a logical zero, the output signal from the inverter 32 enables an AND gate 34, which is primed by the set output signal from the flip-flop 38, to reset the flip-flop 37. The output signal from the AND gate 34 also resets the flip-flop 31. Subsequent input signals from $f_i$ are thereafter passed by the AND gate 30 because of the enabling signal from the reset side of the flip-flop 37.

Figure 4:
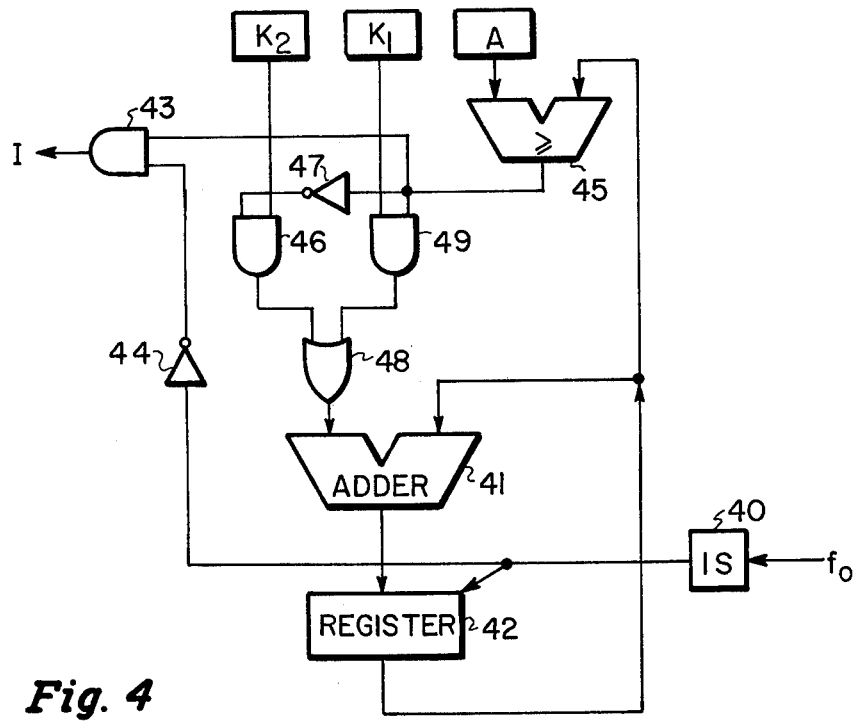
FIG. 4 is a logic diagram showing an embodiment of a controller circuit.

The logic for a controller is illustrated in FIG. 4. A digital accumulator is comprised of an adder 41 and a register 42. A digital accumulator is an operating device for adding an input digital signal to a stored digital signal in response to a control or clocking pulse. The output signal from the accumulator is the stored digital value in the register 42, which is increased at each clocking pulse by an amount equal to the input signal. An accumulator can be assembled from commercially available devices. For example, an arithmetic-logic unit (ALU) such as an integrated circuit type SN74181 (Texas Instruments, Inc.) can be coupled to receive at one set of input terminals the input digital signal and at the other set of input terminals, the stored digital signal. The output signals from the ALU can be coupled, each to a D-input terminal of a separate D-type flip-flop, each clock input signal of the flip-flops being coupled in common to the control or clocking pulse. Integrated circuits having a plurality of flip-flop stages with common clock signals are commercially available, e.g., type SN7475 (four stages) or SN74100 (eight stages) (Texas Instruments, Inc.). The devices described can be cascaded to form digital words of any desired number of bits. For n bits (stages), addition (or subtraction) is performed modulo $2^n$, but an overflow or carry signal is provided when the ALU output value exceeds $2^n-1$.

Each cycle of the output frequency $f_O$ activates a one-shot multivibrator 40, the output pulse from which controls the accumulator by gating the sum signals from the adder 41 into the register 42 and also interrupts the operation of an AND gate 43 via an inverter 44. The output signal from the register 42 is coupled to one set of input terminals of a comparator 45. The other input signals to the comparator 45 represent a constant value A which will be described in more detail below. The output signal from the comparator 45 is a logical one whenever the output value from the register value 42 is less than or equal to the value of A. Such comparators are well known in the art and need not be described in detail. (See, for example, integrated circuit type SN7485 (Texas Instruments, Inc.).) In the illustrative example being described in detail, two's complement arithmetic is used so that the referenced comparator (SN7485) produces an output signal which is the result of ORing output signals from the equality and less-than terminals of the integrated circuit with the sign bit (most significant bit) of the output signal from the register 42. That is, whenever the output value of the register 42 is negative, an output signal of a logical one will be produced from the comparator 45 by the sign bit. The constant A is a positive number and any negative number is less than any positive number.

When the output signal from the comparator 45 is a logical one, an AND gate network 49 is enabled to couple the value of a constant $K_1$ to the adder 41 via an OR gate network 48. The number of parallel AND gates and OR gates required in the network is a function of the number of bits of the constants being used. This is explained in more detail below. When the output signal from the comparator 45 is a logical zero, an AND gate network 46 is enabled via an inverter 47 to couple the value of a different constant $K_2$ to the adder 41 via the OR gate network 48.

The circuit shown in FIG. 4, therefore, adds a value $K_1$ to an accumulative total when the value in the register 42 is less than or equal to the value of A, and adds the value $K_2$ when the value of A is less than the value in the register 42. The value of A is related to the maximum desirable error. The value in the register 42 is the accumulated time error in the output frequency, $f_O$.

When the accumulated error value in the register 42 is less then or equal to the value of A, an inhibit pulse is produced to the pulse inhibit logic via the AND gate 43. This causes a division by M+1 and adds the error associated therewith, $K_1$, to the accumulated error. When the accumulated error is greater than A, no inhibit signal is produced so division over the next period $f_O$ is by M, and the error associated therewith, $K_2$, —a negative value— is added to the accumulated error.

The value of $K_2$ is calculated by $$K_2 = M\ T_i - T_o$$

where
$T_i$ = period of input frequency = $1/f_i$, and
$T_O$ = period of output frequency = $1/f_O$. The value of $K_1$ is calculated by $$K_1 = (M+1)\ T_i - T_o$$

In other words, $K_2$ is the error in the zero crossing time of the divider output signal resulting from dividing $f_i$ by M rather than D over one period of $f_O$, and $K_1$ is the error in the zero crossing time of the divider output signal caused by dividing $f_i$ by M+1 rather than D. In the illustrative example, the values of $K_1$ and $K_2$ are calculated as follows:

$$K_1 = 139 \times (1{,}420{,}405{,}751)^{-1} - (10{,}230{,}000)^{-1} = 1.0765094 \times 10^{-10}\ \text{sec.}$$

and $$K_2 = 138 \times (1{,}420{,}405{,}751)^{-1} - (10{,}230{,}000)^{-1} = -5.9637324 \times 10^{-10}\ \text{sec.}$$

The value of A can be chosen to be any reasonable value larger than $K_1$. In the illustrative example, it will be assumed that A has a value of $3 \times 10^{-10}$ sec. The values of $K_1$, $K_2$ and A can be rewritten as $$K_1 = 10{,}765{,}094 \times 10^{-17}\ \text{sec.,}$$

$$K_2 = -59{,}637{,}324 \times 10^{-17}\ \text{sec.,}$$

and $$A = 30{,}000{,}000 \times 10^{-17} \text{ sec.}$$

Since all three numbers have the same exponents, the notation $\times 10^{-17}$ seconds can be dropped. The above three numbers can then be coded into binary as follows:

$$K_1 = 000101001000100001100100110;$$

$$K_2 = 100011100100000000110110100;$$

and $$A = 001110010011100001110000000$$

The most significant bit of the above numbers is the sign bit, which in two's-complement, is a one to indicate a negative number or a zero to indicate a positive number. For describing the operation of the adder 41 of FIG. 4, it is more convenient to express the above binary numbers in their corresponding octal numbers; each octal digit is a combination of 3 binary bits. The values of in octal are as follows:

$$K_1 = 051041446;$$

$$K_2 = 434400664;$$

and $$A = 162341600.$$

Assuming that the initial value in the register 42 is zero, then after dividing the input frequency by 139, the output signal from the comparator 45 will add the value of $K_1$ to the value in the accumulator. Therefore, after the first cycle of $f_0$, the value in the register 42 is equal to the value of $K_1$, i.e., 051041446. Since this value is less than that of A, the output signal from the comparator 45 will be a logical one so that the value of $K_1$ is again added into the accumulator (and $f_1$ is divided by 139). After the second cycle of $f_0$, the value in the register 42 is 122103114. Since this value is still less than the value of A, another division by 139 is performed and at the end of the third cycle of $f_0$, the value in the accumulator register 42 is 173144562. Since this value is greater than the value of A, the value of $K_2$ is added and the absence of an inhibit signal from the AND gate 43 causes the divider circuit to divide by 138. At the end of the fourth cycle of $f_0$, the value in the accumulator register 42 will be 627545446. In this octal representation of binary, the most significant bit is set, indicating a negative value. Therefore, the output signal from the comparator 45 will be a logical one. Following the next division by 139, the value of $K_1$ is added to the value of the accumulator 42 to give a value of 700607114, which is again a negative number, and so on.

The operation of the circuit according to the invention is summarized in the table below. The value entries are decimal values rather than binary or octal.

In Table I, the numbers in the first column, labelled Division Sequence Number, are the sequential periods of $f_0$. The next two columns indicate whether the division during the given period was by 138 or 139 and give the cumulative number of divides by each value. The fourth column is the accumulated error. The fifth column shows the total elapsed time for selected cycles. The octal equivalent of the first five values in the accumulated error column are (converted to $\times 10^{-17}$ sec.) 51041446, 122103114, 173144562, −150232332, and −77170664. The last two numbers in complementary form are 627545446 and 700607114. These are the same numbers derived in the previous description of the operation of the controller.

Figure 5:
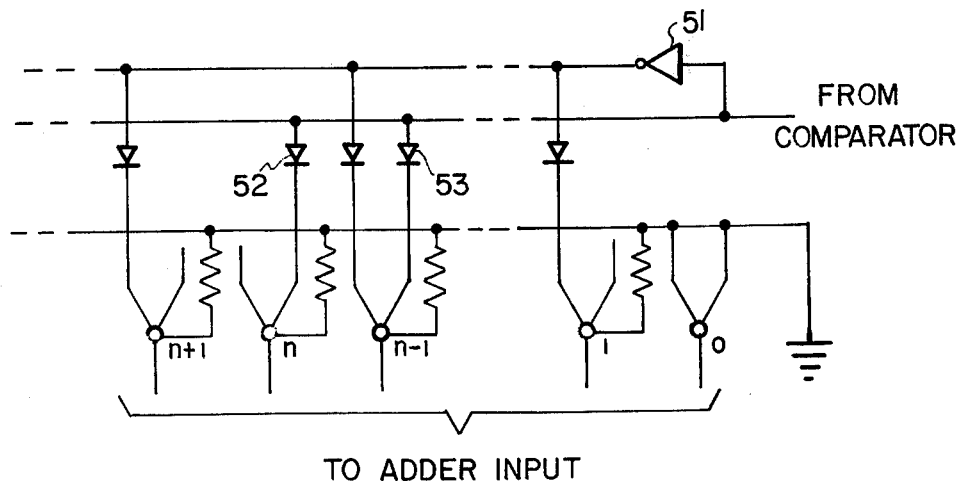
FIG. 5 is a schematic of a circuit for coupling binary constant values to an adder input.

FIG. 5 shows a circuit for coupling the values of $K_1$ and $K_2$ to the adder input terminals which does not require the AND gate networks 46 and 49 nor the OR gate network 48. An inverter 51 performs the same function in the circuit of FIG. 5 as the inverter 47 performs in the circuit of FIG. 4. When the output signal from the comparator is a logical one, the $n$th bit and the $(n+1)$th and zero position bits are logical zeroes. The one values in bit positions $n$ and $n-1$ are the voltage signals passed by the diodes 52 and 53, respectively. Similarly, when the output signal from the comparator is a logical zero, the logical one signal from the inverter 51 is coupled to bit positions $n+1$, $n-1$, and 1.

TABLE I

| Division Sequence Number | CUMULATIVE OPERATION | | Accumulated Timing Error ($\times 10^{-10}$ sec) | Elapsed Time (Seconds) |
|---|---|---|---|---|
| | CUMULATIVE DIVIDES | | | |
| | ÷ 138 | ÷ 139 | | |
| 0 | 0 = 0 | 0 = 0 | | |
| 1 | + 0 = 0 | + 1 = 1 | 1.0765094 | 0 |
| 2 | + 0 = 0 | + 1 = 2 | 2.1530188 | |
| 3 | + 0 = 0 | − 1 = 3 | 3.2295282 | |
| 4 | + 1 = 1 | + 0 = 3 | − 2.7342042 | |
| 5 | + 0 = 1 | + 1 = 4 | − 1.6576948 | |
| 6 | + 0 = 1 | + 1 = 5 | − 0.5811854 | |
| 7 | + 0 = 1 | + 1 = 6 | + 0.495324 | |
| 8 | + 0 = 1 | + 1 = 7 | + 1.5718334 | |
| 9 | + 0 = 1 | + 1 = 8 | + 2.6483428 | $9.775 + \times 10^{-7}$ |
| 10 | + 1 = 2 | + 0 = 8 | − 3.3153896 | |
| 11 | + 0 = 2 | + 1 = 9 | − 2.2388802 | |
| 12 | + 0 = 2 | + 1 = 10 | − 1.1623708 | |
| . | . | . | . | |
| 21 | + 0 = 3 | + 1 = 18 | + 1.485972 | |
| 22 | + 0 = 3 | + 1 = 19 | + 2.5624814 | |
| 23 | + 1 = 4 | + 0 = 19 | − 3.401251 | |
| 24 | + 0 = 4 | + 1 = 20 | − 2.3247416 | |
| 25 | + 0 = 4 | + 1 = 21 | − 1.2482322 | |
| . | . | . | . | |
| 30 | + 1 = 5 | + 0 = 25 | − 2.905927 | |
| 31 | + 0 = 5 | + 1 = 26 | − 1.8294176 | |
| 32 | + 0 = 5 | + 1 = 27 | − 0.7529082 | |
| 33 | + 0 = 6 | + 1 = 28 | + 0.3436012 | $3.226 \times 10^{-6}$ |
| . | . | . | . | . |
| 1,000,000 | 152,908 | 847,092 | 0.1069 | 0.9775 |

A system has been described for dividing a first frequency by a non-integer value to produce a second frequency which has an accuracy depending on the number of bits used to represent the constant values.

Various modifications of the systems and circuits described and illustrated to explain the concepts and modes of practicing the invention might be made by those of ordinary skill in the art within the principles or scope of the invention as expressed in the appended claims.

What is claimed is:

1. A circuit, producing from a signal at a first frequency a signal at a second frequency, said first and second frequencies being related by a non-integral ratio, comprising the combination of:
    gating means receptive of said first frequency signal for producing pulses in response thereto when enabled by an enabling signal;
    divider means responsive to said pulses for producing said second frequency signal; and control means responsive to said second frequency signal for enabling said gating means said control means comprising:
  means for accumulating a known error value associated with said second frequency signal; and
  means responsive to said means for accumulating for producing said enabling signal and supplying it to said gating means while the accumulated error value is less than a predetermined value.

2. The invention claimed in claim 1 wherein said gating means includes means responsive to the absence of said enabling signal for inhibiting said pulses for one period of said first frequency during one period of said second frequency.

3. The invention claimed in claim 2 wherein said control means further comprises
  register means for storing a predetermined error value;
  comparator means responsive to said means for accumulating and to said register means for producing an output signal of one value when said accumulated error value exceeds said predetermined error value and of another value when dsia accumulated error value does not exceed said predetermined error value;
  first storage means for storing a first error value related to the divider means division ratio;
  second storage means for storing a second error value related to the divider means division ratio plus one; and
  means responsive to said signal at said second frequency for supplying the error value stored in said first storage means to said means for accumulating in response to said one value of the output signal from said comparator means and for supplying the error value stored in said second storage means to said means for accumulating in response to said other value of the output signal from said comparator means.

4. The method of dividing a first frequency signal by a non-integer divisor to produce a second frequency signal comprising the steps of:
  producing a train of pulses by gating said first frequency signal;
  dividing said pulse train by an integer value; and
  inhibiting the production of said pulse train when said second frequency signal includes an error exceeding a desired value wherein said inhibiting step comprises
  accumulating a known error for each period of said second frequency;
  comparing said accumulated error to a predetermined value; and
  producing an inhibiting signal when said comparing step indicates the accumulated error exceeds the predetermined value.

* * * * *